US010763552B2

(12) United States Patent
Dan et al.

(10) Patent No.: US 10,763,552 B2
(45) Date of Patent: Sep. 1, 2020

(54) INSULATION DETECTION CIRCUIT AND METHOD, AND BATTERY MANAGEMENT SYSTEM

(71) Applicant: Contemporary Amperex Technology Co., Limited, Ningde, Fujian (CN)

(72) Inventors: Zhimin Dan, Ningde (CN); Meng Li, Ningde (CN); Yizhen Hou, Ningde (CN); Wei Zhang, Ningde (CN); Lidan Yan, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 11 days.

(21) Appl. No.: 16/245,198

(22) Filed: Jan. 10, 2019

(65) Prior Publication Data

US 2019/0237815 A1    Aug. 1, 2019

(30) Foreign Application Priority Data

Feb. 1, 2018  (CN) .......................... 2018 1 0102891

(51) Int. Cl.
*G01R 31/382* (2019.01)
*H01M 10/42* (2006.01)
(Continued)

(52) U.S. Cl.
CPC ........ *H01M 10/425* (2013.01); *G01R 27/025* (2013.01); *G01R 31/382* (2019.01);
(Continued)

(58) Field of Classification Search
CPC .............. G01R 31/333; G01R 27/2617; G01R 31/1272; H01H 9/50
See application file for complete search history.

(56) References Cited

U.S. PATENT DOCUMENTS 5,382,946 A     1/1995  Gale
2003/0214306 A1* 11/2003 Beutelschiess ......... B60L 58/34
                                              324/511
(Continued)

FOREIGN PATENT DOCUMENTS

CN      201886117 U    6/2011
CN      102749562 A   10/2012
(Continued)

OTHER PUBLICATIONS

The first Office Action and search report dated Jan. 3, 2020 for Chinese Application No. 201810102891.X, 9 pages.
(Continued)

*Primary Examiner* — Tung X Nguyen
(74) *Attorney, Agent, or Firm* — Law Offices of Liaoteng Wang

(57) ABSTRACT

The present disclosure provides an insulation detection circuit and method, and a battery management system. The circuit includes a first isolation module, a voltage division module, a signal generation module, first and second sampling points and a processor. A first end of the first isolation module is connected to a power battery, and a second end of the first isolation module is connected to the second sampling point. The signal generation module is connected to the first sampling point and configured to inject an AC signal into the power battery and provide the first sampling point with a first sampled signal. A first end of the voltage division module is connected to the first sampling point, and a second end of the voltage division module is connected to the second sampling point. The processor is configured to calculate an insulation resistance of the power battery.

18 Claims, 6 Drawing Sheets

(51) Int. Cl.
    *G01R 27/02*     (2006.01)
    *G01R 31/3835*     (2019.01)
    *G01R 31/50*     (2020.01)
    *G01R 31/396*     (2019.01)
    *H01M 10/48*     (2006.01)
    *G01R 31/12*     (2020.01)

(52) U.S. Cl.
    CPC ....... *G01R 31/3835* (2019.01); *G01R 31/396* (2019.01); *G01R 31/50* (2020.01); *H01M 10/482* (2013.01); *G01R 31/12* (2013.01); *H01M 2010/4271* (2013.01); *H01M 2220/20* (2013.01)

(56) References Cited

U.S. PATENT DOCUMENTS

| | | |
|---|---|---|
| 2007/0188948 A1 | 8/2007 | Morita |
| 2014/0058687 A1* | 2/2014 | Wang .................. H01M 10/48 702/51 |
| 2015/0226782 A1 | 8/2015 | Cordesses et al. |

FOREIGN PATENT DOCUMENTS

| | | |
|---|---|---|
| CN | 103076497 A | 5/2013 |
| CN | 203720270 U | 7/2014 |
| CN | 204269735 U | 4/2015 |
| CN | 205176140 U | 4/2016 |
| CN | 206161785 U | 5/2017 |
| CN | 206292308 U | 6/2017 |
| CN | 107607785 A | 1/2018 |
| EP | 2105753 A1 | 9/2009 |
| JP | 5382813 B2 | 1/2014 |
| JP | 2016080526 A | 5/2016 |

OTHER PUBLICATIONS

The extended European search report dated Jun. 21, 2019 for European Application No. 19151942.0, 10 pages.
The first Office Action dated May 15, 2020 for European Application No. 19151942.0, 23 pages.
Janet Heath: "Unity gain amplifier or voltage follower in a voltage divider", May 5, 2017, 7 pages.

* cited by examiner

INSULATION DETECTION CIRCUIT AND METHOD, AND BATTERY MANAGEMENT SYSTEM

CROSS-REFERENCE TO RELATED APPLICATION

This application is based upon and claims priority to Chinese Patent Application No. 201810102891.X, filed on Feb. 1, 2018, the content of which is incorporated herein by reference in its entirety.

FIELD

The present disclosure relates to the field of batteries, particularly to an insulation detection circuit and method, and a battery management system.

BACKGROUND

A power battery is responsible for storing and supplying electric energy. In use, it is necessary to design an insulation detection circuit to monitor in real time whether an insulation resistance of an entire high voltage system of an electric vehicle (including the insulation resistance of a power battery pack and the entire vehicle) meets a standard, so as to avoid high voltage safety issues caused in the case that the insulation resistance of the high voltage system of the electric vehicle does not meet the standard.

In order to detect the insulation resistance of the power battery, a conventional insulation detection circuit needs to directly inject a high-frequency AC (Alternating Current) signal into the power battery, connect one end of the high-frequency AC signal to the ground or a body of the vehicle, and then calculate the insulation resistance according to acquired signals.

However, inventors of the present application found that when using the existing method of injecting the high-frequency signal, the detection result of the insulation resistance is usually impacted by a parasitic capacitance of the power battery under detection, resulting in a large detection error of the insulation resistance.

SUMMARY

An insulation detection circuit, an insulation detection method and a battery management system are provided in the embodiments of the present disclosure.

In a first aspect of the present disclosure, an insulation detection circuit is provided and includes a first isolation module, a voltage division module, a signal generation module, a first sampling point, a second sampling point and a processor, wherein a first end of the first isolation module is connected to a positive electrode of a power battery under detection, and a second end of the first isolation module is connected to the second sampling point; the signal generation module is connected to the first sampling point and configured to inject an AC signal of a predetermined frequency into the power battery under detection and provide the first sampling point with a first sampled signal of the predetermined frequency; a first end of the voltage division module is connected to the first sampling point, a second end of the voltage division module is connected to the second sampling point, and the voltage division module is configured to provide the second sampling point with a second sampled signal; and the processor is configured to calculate an insulation resistance of the power battery under detection according to the first sampled signal and the second sampled signal.

In an implementation of the first aspect, the voltage division module includes a voltage division resistor, a first end of the voltage division resistor is connected to the first sampling point, and a second end of the voltage division resistor is connected to the second sampling point.

In an implementation of the first aspect, the first isolation module comprises an isolation capacitor, a first end of the isolation capacitor is connected to the positive electrode of the power battery under detection, and a second end of the isolation capacitor is connected to the second sampling point.

In an implementation of the first aspect, the insulation detection circuit further includes a first sampling circuit, wherein a first end of the first sampling circuit is connected to the first sampling point, a second end of the first sampling circuit is connected to the processor, and the first sampling circuit is configured to acquire the first sampled signal from the first sampling point.

In an implementation of the first aspect, the insulation detection circuit further includes a second isolation module, wherein a first end of the second isolation module is connected to the first sampling point, a second end of the second isolation module is connected to the first sampling circuit, and the second isolation module is configured to isolate signal interference of the first sampling circuit on the first sampling point.

In an implementation of the first aspect, the second isolation module includes a first voltage follower, a first input terminal of the first voltage follower is connected to the first sampling point, and a second input terminal of the first voltage follower is connected to an output terminal of the first voltage follower.

In an implementation of the first aspect, the insulation detection circuit further includes a second sampling circuit, wherein a first end of the second sampling circuit is connected to the second sampling point, a second end of the second sampling circuit is connected to the processor, and the second sampling circuit is configured to acquire the second sampled signal from the second sampling point.

In an implementation of the first aspect, the insulation detection circuit further includes a third isolation module, wherein a first end of the third isolation module is connected to the second sampling point, a second end of the third isolation module is connected to the second sampling circuit, and the third isolation module is configured to isolate signal interference of the second sampling circuit on the second sampling point.

In an implementation of the first aspect, the third isolation module includes a second voltage follower, a first input terminal of the second voltage follower is connected to the second sampling point, and a second input terminal of the second voltage follower is connected to an output terminal of the second voltage follower.

In an implementation of the first aspect, the insulation detection circuit further includes a signal amplification module, wherein a first input terminal of the signal amplification module is connected to the signal generation module, a second input terminal of the signal amplification module is connected to an output terminal of the signal amplification module, the output terminal of the signal amplification module is connected to the first sampling point, and the second input terminal of the signal amplification module is further connected to a reference voltage terminal.

In an implementation of the first aspect, the signal amplification module includes a signal amplifier, a first amplification resistor, a second amplification resistor, and a third amplification resistor, wherein a first input terminal of the signal amplifier is connected to the signal generation module, and the first amplification resistor is located on a line between the first input terminal of the signal amplifier and the signal generation module; a second input terminal of the signal amplifier is connected to the output terminal of the signal amplifier, and the second amplification resistor is located on a line between the second input terminal of the signal amplifier and the output terminal of the signal amplifier; the output terminal of the signal amplifier is connected to the first sampling point; the second input terminal of the signal amplification module is further connected to the reference voltage terminal, and the third amplification resistor is located on a line between the second input terminal of the signal amplification module and the reference voltage terminal.

In an implementation of the first aspect, the insulation detection circuit further includes a first sampling circuit and a second sampling circuit, wherein a first end of the first sampling circuit is connected to the first sampling point, a second end of the first sampling circuit is connected to the processor, and the first sampling circuit is configured to provide the first sampled signal to the processor; a first end of the second sampling circuit is connected to the second sampling point, a second end of the second sampling circuit is connected to the processor, and the second sampling circuit is configured to provide the second sampled signal to the processor.

In an implementation of the first aspect, the signal generation module is a DDS waveform generator.

In an implementation of the first aspect, the predetermined frequency is less than or equal to 50 kHz.

In a second aspect of the present disclosure, a battery management system is provided and includes the above described insulation detection circuits.

In a third aspect of the present disclosure, an insulation detection method is provided to be applied to the above described insulation detection circuits. The method includes calculating the insulation resistance of the power battery under detection according to the first sampled signal and the second sampled signal.

In an implementation of the third aspect, the calculating the insulation resistance of the power battery under detection according to the first sampled signal and the second sampled signal includes: obtaining a first voltage amplitude and a bias voltage in the first sampled signal and a second voltage amplitude in the second sampled signal, and obtaining a first instantaneous voltage in the first sampled signal and a second instantaneous voltage in the second sampled signal at a same moment; calculating a phase shift of the second sampled signal relative to the first sampled signal according to the first voltage amplitude, the bias voltage, the first instantaneous voltage, the second voltage amplitude, and the second instantaneous voltage; and calculating the insulation resistance of the power battery under detection according to the phase shift, the first voltage amplitude, and the second voltage amplitude.

In an implementation of the third aspect, the obtaining a first instantaneous voltage in the first sampled signal and a second instantaneous voltage in the second sampled signal at a same moment includes: obtaining the first instantaneous voltage at a rising edge of a waveform in the first sampled signal and the second instantaneous voltage at a rising edge of a waveform in the second sampled signal at the same moment.

In an implementation of the third aspect, the calculating the insulation resistance of the power battery under detection according to the phase shift, the first voltage amplitude, and the second voltage amplitude includes: calculating the insulation resistance of the power battery under detection according to the phase shift, the first voltage amplitude, the second voltage amplitude, the predetermined frequency, the capacitance of the first isolation module and the resistance of the voltage division module.

BRIEF DESCRIPTION OF THE DRAWINGS

The invention may be better understood from the following description of the specific embodiments of the invention, taken in conjunction with the accompanying drawings, in which like or similar reference numerals indicate identical or similar features.

DETAILED DESCRIPTION

The features and exemplary embodiments of various aspects of the present disclosure are described in detail below. In the following detailed description, numerous specific details are set forth in order to provide a thorough understanding of the present disclosure.

The embodiments of the present disclosure provide an insulation detection circuit and method, and a battery management system. With the method of injecting an AC signal into a power battery under detection, the insulation detection circuit can separately process a detected sine wave voltage signal from a signal generation module and a detected sine wave voltage signal between an isolation module and a voltage division module to obtain the insulation resistance of the power battery under detection, thus resulting in an improved detection accuracy of the insulation resistance.

It should be noted that the power battery under detection in the embodiments of the present disclosure may be a lithium-ion battery, a lithium-metal battery, a lead-acid battery, a nickel-cadmium battery, a nickel-metal hydride battery, a lithium-sulfur battery, a lithium-air battery, or a sodium-ion battery, which is not limited herein. In terms of scale, the power battery under detection can be a single cell or a battery module or a battery pack, which is not limited herein either.

The battery management system includes the above insulation detection circuit. For example, the above insulation detection circuit may be integrated in the battery management system.

Figure 1:
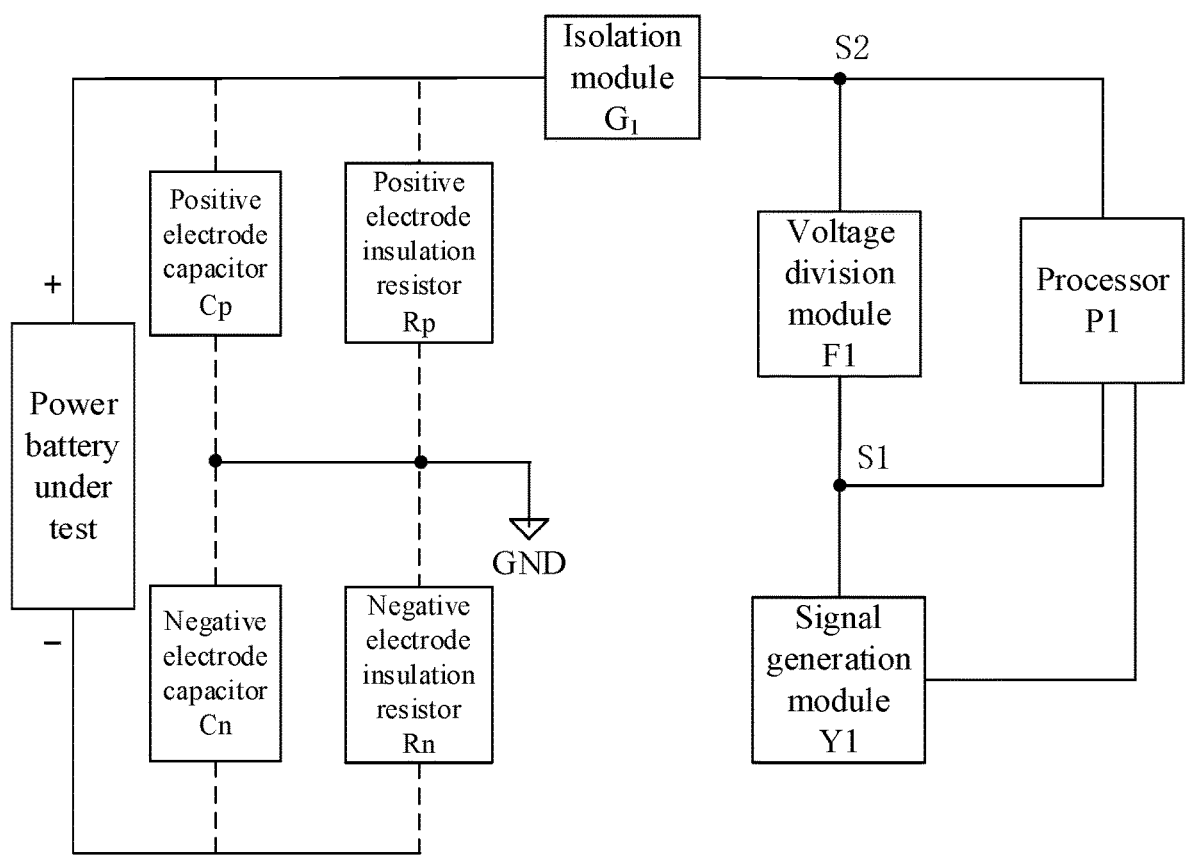
FIG. 1 is a schematic structural diagram of an insulation detection circuit according to a first embodiment of the present disclosure.

FIG. 1 is a schematic structural diagram of an insulation detection circuit according to a first embodiment of the present disclosure. As shown in FIG. 1, the insulation detection circuit includes a first isolation module G1, a voltage division module F1, a signal generation module Y1, a first sampling point S1, a second sampling point S2 and a processor P1.

A first end of the first isolation module G1 is connected to a positive electrode of the power battery under detection, and a second end of the first isolation module G1 is connected to the second sampling point S2. The first isolation module G1 may be configured to isolate a high-voltage signal of the power battery under detection from interfering with a low-voltage sampled signal.

The signal generation module Y1 is connected to the first sampling point S1. The signal generation module Y1 may be configured to inject an AC signal of a predetermined frequency into the power battery under detection and provide the first sampling point S1 with a first sampled signal of a predetermined frequency.

A first end of the voltage division module F1 is connected to the first sampling point S1, and a second end of the voltage division module F1 is connected to the second sampling point S2. The voltage division module F1 may be configured to provide the second sampling point S2 with a second sampled signal, which is the sampled signal for the second sampling point S2 at the voltage division module F1.

The processor P1 may be configured to calculate the insulation resistance of the power battery under detection according to the first sampled signal and the second sampled signal.

A positive electrode capacitor Cp, a negative electrode capacitor Cn, a positive electrode insulation resistor Rp and a negative electrode insulation resistor Rn of the power battery under detection are also shown in FIG. 1.

It can be understood that the positive electrode capacitor Cp and the negative electrode capacitor Cn are equivalent capacitors of the power battery under detection relative to a low-voltage ground, the positive electrode insulation resistor Rp is the insulation resistor of the positive electrode of the power battery under detection relative to the low-voltage ground, and the negative electrode insulation resistor Rn is the insulation resistor of a negative electrode of the power battery under detection relative to the low-voltage ground.

In the embodiment of the present disclosure, an AC voltage signal injected by the signal generation module Y1 can be acquired from the first sampling point S1, and an AC voltage signal between the voltage division module F1 and the first isolation module G1 can be acquired from the second sampling point S2. The AC voltage signal between the voltage divider module F1 and the first isolation module G1 may be affected by the insulation resistance of the power battery under detection. Thus based on Kirchhoff's law, the insulation resistance of the power battery under detection can be calculated by a comparison between the AC voltage signal at the first sampling point S1 and the AC voltage signal at the second sampling point S2.

The embodiment of the present disclosure provides the insulation detection circuit including the first isolation module G1, the voltage division module F1, the signal generation module Y1, the first sampling point S1 and the second sampling point S2. The first end of the first isolation module G1 is connected to the positive electrode of the power battery under detection, and the second end of the first isolation module G1 is connected to the second end of the voltage division module F1. The first isolation module G1 can isolate the high-voltage signal of the power battery under detection from interfering with the low-voltage sampled signal. Compared with the conventional method of directly injecting a high frequency AC signal into the power battery under detection, in the embodiment of the present disclosure, the high-voltage signal of the power battery under detection can be isolated from impacting on a low-voltage sampling circuit, and thus the first sampled signal obtained from the first sampling point S1 and the second sampled signal obtained from the second sampling point S2 can be made more accurate and accordingly the detection accuracy of the insulation resistance can be improved.

In addition, since the insulation detection circuit in the embodiment of the present disclosure only needs to further include the first isolation module G1 which can be specifically implemented by an isolation capacitor, it may have the advantage of low cost.

In addition, according to the embodiment of the present disclosure, since it is only needed to detect the AC voltage signal at the first sampling point S1 and the AC voltage signal at the second sampling point S2 in order to calculate the insulation resistance of the power battery under detection, the calculation speed can be fast, the time for detecting the insulation resistance can be shortened and the stability of the system will not be impacted.

In some embodiments, the signal generation module Y1 can be a Direct Digital Synthesis (DDS) waveform generator. Stability and accuracy of a frequency of a signal from the DDS waveform generator can reach the same level as a reference frequency, and the frequency can be finely adjusted over a wide frequency range. A signal source designed in this way can work in a modulation state, in which an output level can be adjusted to obtain an output of various waveforms, such as a triangular wave, a square wave, and the like.

In other embodiments, the first sampled signal generated by the signal generation module Y1 may be a low-frequency AC signal. In other words, a low-frequency AC signal may be injected into the power battery under detection. For example, the frequency may be less than or equal to 50 kHz. In comparison to the high frequency AC signal being injected into the power battery under detection, the low frequency AC signal is less impacted by the high-voltage signal of the power battery under detection, so that the detection accuracy of the insulation detection circuit can be further improved.

As shown in FIG. 1, in some embodiments, the processor P1 may be further configured to output an enable control signal to the signal generation module Y1 in response to the desire of detecting the power battery under detection, so as to perform an automatic control to enable or disable the insulation detection circuit.

Figure 2:
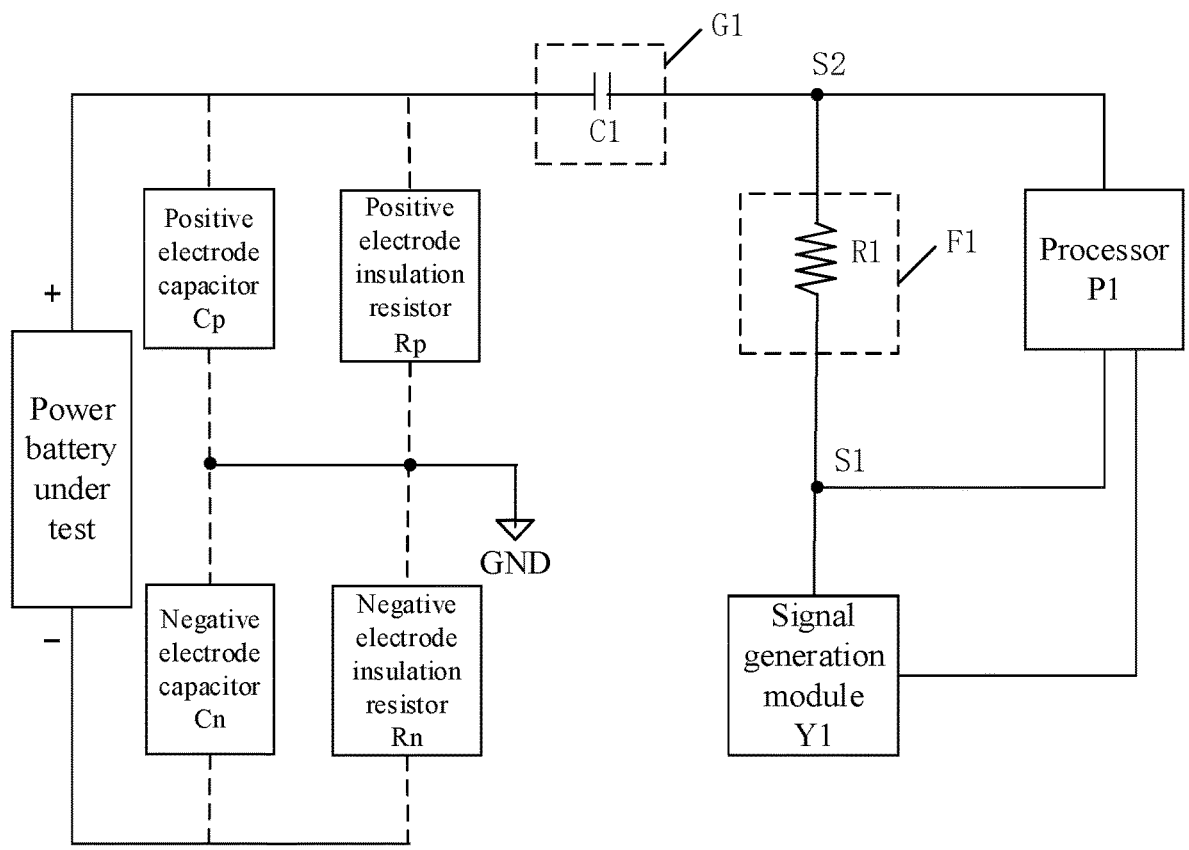
FIG. 2 is a schematic structural diagram of an insulation detection circuit according to a second embodiment of the present disclosure.

FIG. 2 is a schematic structural diagram of an insulation detection circuit according to a second embodiment of the present disclosure. FIG. 2 differs from FIG. 1 in that FIG. 2 shows components of the voltage division module F1 and the first isolation module G1. The specific structures of the voltage division module F1 and the first isolation module G1 will be illustrated below by way of examples.

The voltage division module F1 may include a voltage division resistor R1. A first end of the voltage division resistor R1 is connected to the first sampling point S1, and a second end of the voltage division resistor R1 is connected to the second sampling point S2. The voltage division resistor R1 can function as a voltage divider. A variation range of the sampled signal at the second sampling point S2 can be adjusted by changing the resistance of the voltage division resistor R1.

The first isolation module G1 may include an isolation capacitor C1. A first end of the isolation capacitor C1 is connected to the positive electrode of the power battery under detection, and a second end of the first isolation capacitor C1 is connected to the second sampling point S2. The isolation capacitor C1 can isolate high voltages at the power battery side from low-voltage sampled signals. In addition, by changing the capacitance of the isolation capacitor C1, the isolation effect between high voltages at the power battery side and a low-voltage sampling circuit can be adjusted.

Figure 3:
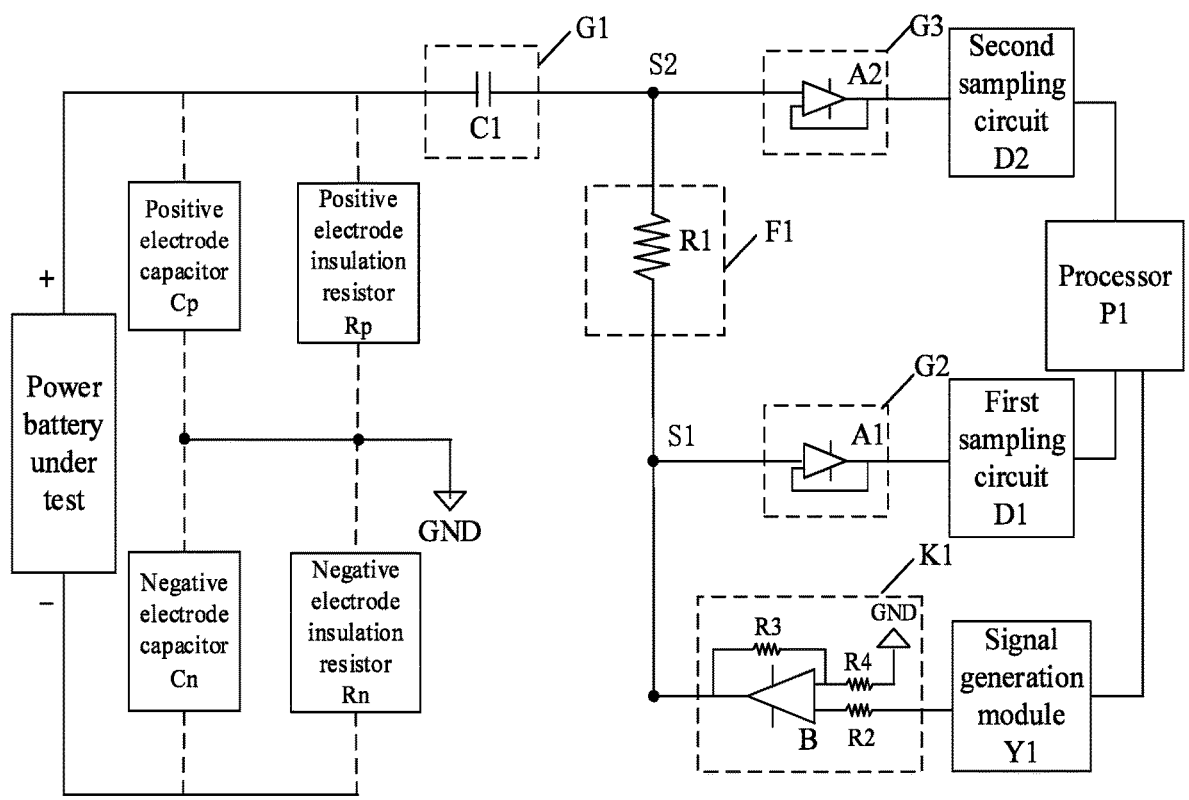
FIG. 3 is a schematic structural diagram of an insulation detection circuit according to a third embodiment of the present disclosure.

FIG. 3 is a schematic structural diagram of an insulation detection circuit according to a third embodiment of the present disclosure. FIG. 3 differs from FIG. 2 in that the insulation detection circuit shown in FIG. 3 further includes a first sampling circuit D1 and a second sampling circuit D2. In the embodiment of the present disclosure, the processor P1 may directly acquire an AC signal from the first sampling point S1 or the second sampling point S2, or may acquire the AC signal from the first sampling point S1 or the second sampling point S2 via a dedicated sampling circuit.

A first end of the first sampling circuit D1 is connected to the first sampling point S1, and a second end of the first sampling circuit D1 is connected to the processor P1. The first sampling circuit D1 may be configured to acquire the first sampled signal from the first sampling point D1.

A first end of the second sampling circuit D2 is connected to the second sampling point S2, and a second end of the second sampling circuit D2 is connected to the processor P1. The second sampling circuit D2 may be configured to acquire the second sampled signal from the second sampling point S2. A person skilled in the art can select an appropriate sampling circuit based on practical needs, which is not limited herein.

In the example of FIG. 3, the insulation detection circuit may further include a second isolation module G2 and a third isolation module G3.

A first end of the second isolation module G2 is connected to the first sampling point S1, and a second end of the second isolation module G2 is connected to the first sampling circuit D1. The second isolation module G2 may be configured to isolate signal interference of the first sampling circuit D1 on the first sampling point S1.

Specifically, the second isolation module G2 may include a first voltage follower A1. A first input terminal of the first voltage follower A1 is connected to the first sampling point S1, and a second input terminal of the first voltage follower A1 is connected to an output terminal of the first voltage follower A1. With the first voltage follower A1, the signal interference of the first sampling circuit D1 on the first sampling point S1 can be isolated.

A first end of the third isolation module G3 is connected to the second sampling point S2, and a second end of the third isolation module G3 is connected to the second sampling circuit D2. The third isolation module G3 may be configured to isolate signal interference of the first sampling circuit D2 on the first sampling point S2.

Specifically, the third isolation module G3 includes a second voltage follower A2. A first input terminal of the second voltage follower A2 is connected to the second sampling point S2, and a second input terminal of the second voltage follower A2 is connected to an output terminal of the second voltage follower A2. With the second voltage follower A2, the signal interference of the second sampling circuit D2 on the second sampling point S2 can be isolated.

In the example of FIG. 3, the insulation detection circuit may further include a signal amplification module K1. A first input terminal of the signal amplification module K1 is connected to the signal generation module Y1, a second input terminal of the signal amplification module K1 is connected to an output terminal of the signal amplification module K1, the output terminal of the signal amplification module K1 is connected to the first sampling point S1, and the second input terminal of the signal amplification module K1 is further connected to a reference voltage terminal GND.

In the embodiment of the present disclosure, a voltage amplitude of the AC signal generated by the signal generation module Y1 can be adjusted via the signal amplification module K1. For example, when the voltage amplitude of the AC signal generated by the signal generation module Y1 is small, the voltage amplitude of the AC signal may be increased, so as to avoid the problem of low accuracy of the insulation detection due to a very low voltage amplitude of the AC signal.

Specifically, the signal amplification module K1 may include a signal amplifier B, a first amplification resistor R2, a second amplification resistor R3, and a third amplification resistor R4. A first input terminal of the signal amplifier B is connected to the signal generation module Y1, and the first amplification resistor R2 is located on a line between the first input terminal of the signal amplifier B and the signal generation module Y1. A second input terminal of the signal amplifier B is connected to an output terminal of the signal amplifier B, and the second amplification resistor R3 is located on a line between the second input terminal of the signal amplifier B and the output terminal of the signal amplifier B. The output terminal of the signal amplifier B is connected to the first sampling point S1. The second input terminal of the signal amplification module K1 is further connected to the reference voltage terminal GND, and the third amplification resistor R4 is located on a line between the second input terminal of the signal amplification module K1 and the reference voltage terminal GND.

The embodiments of the present disclosure further provide a battery management system, which includes the insulation detection circuit as described above.

In the embodiments of the present disclosure, based on the above insulation detection circuit, the insulation resistance of the power battery under detection can be calculated according to the first sampled signal and the second sampled signal. The process of calculating the insulation resistance of the power battery under detection based on the above-mentioned insulation detection circuit according to the embodiments of the present invention will be described in detail below.

Figure 4:
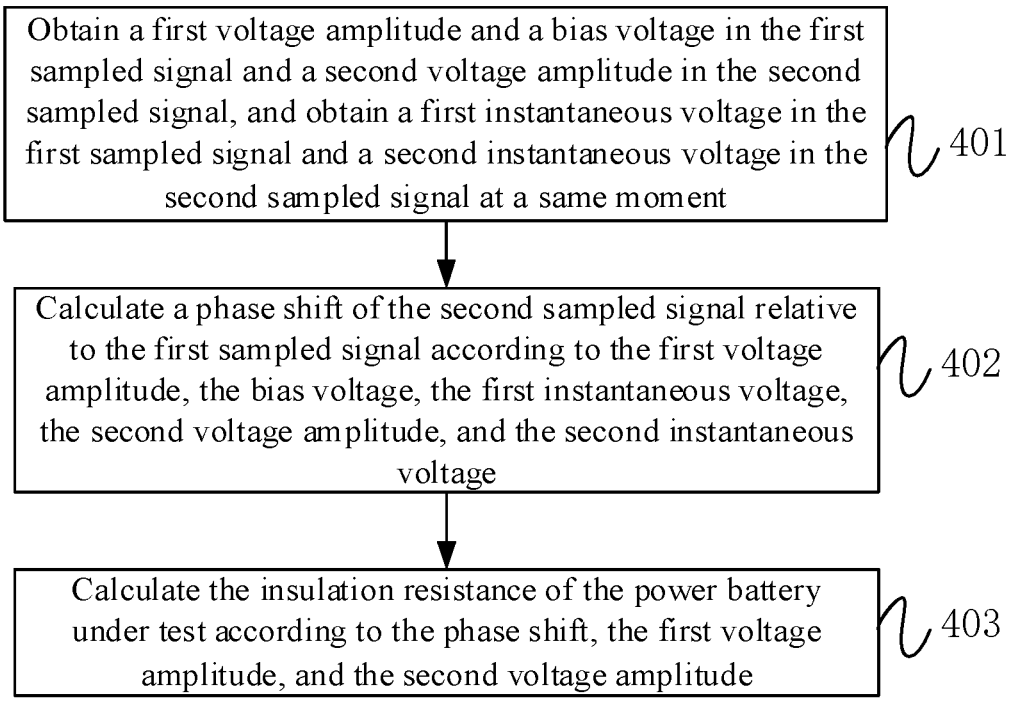
FIG. 4 is a schematic flow chart of an insulation detection method according to a first embodiment of the present disclosure.

FIG. 4 is a schematic flow chart of an insulation detection method according to a first embodiment of the present disclosure, which is applied in the insulation detection circuits as shown in FIG. 1 to FIG. 3. The insulation detection method shown in FIG. 4 may include steps 401 to 403.

In step 401, a first voltage amplitude and a bias voltage in the first sampled signal are obtained, a second voltage amplitude in the second sampled signal is obtained, and a first instantaneous voltage in the first sampled signal and a second instantaneous voltage in the second sampled signal are obtained at a same moment.

Preferably, the first instantaneous voltage at a rising edge of the waveform in the first sampled signal and the second instantaneous voltage at a rising edge of the waveform in the second sampled signal may be obtained at the same moment to improve the calculation accuracy of phase shifts and accordingly increase the insulation detection accuracy.

In step 402, a phase shift of the second sampled signal relative to the first sampled signal is calculated according to the first voltage amplitude, the bias voltage, the first instantaneous voltage, the second voltage amplitude, and the second instantaneous voltage.

In step 403, the insulation resistance of the power battery under detection is calculated according to the phase shift, the first voltage amplitude, and the second voltage amplitude.

Specifically, the insulation resistance of the power battery under detection can be calculated according to the phase shift, the first voltage amplitude, the second voltage amplitude, the predetermined frequency, the capacitance of the first isolation module G1, and the resistance of the voltage division module F1.

To facilitate understanding by those skilled in the art, the process of calculating the insulation resistance of the power battery under detection based on the above-mentioned insulation detection circuit according to embodiments of the present invention will be described in detail below.

Figure 5:
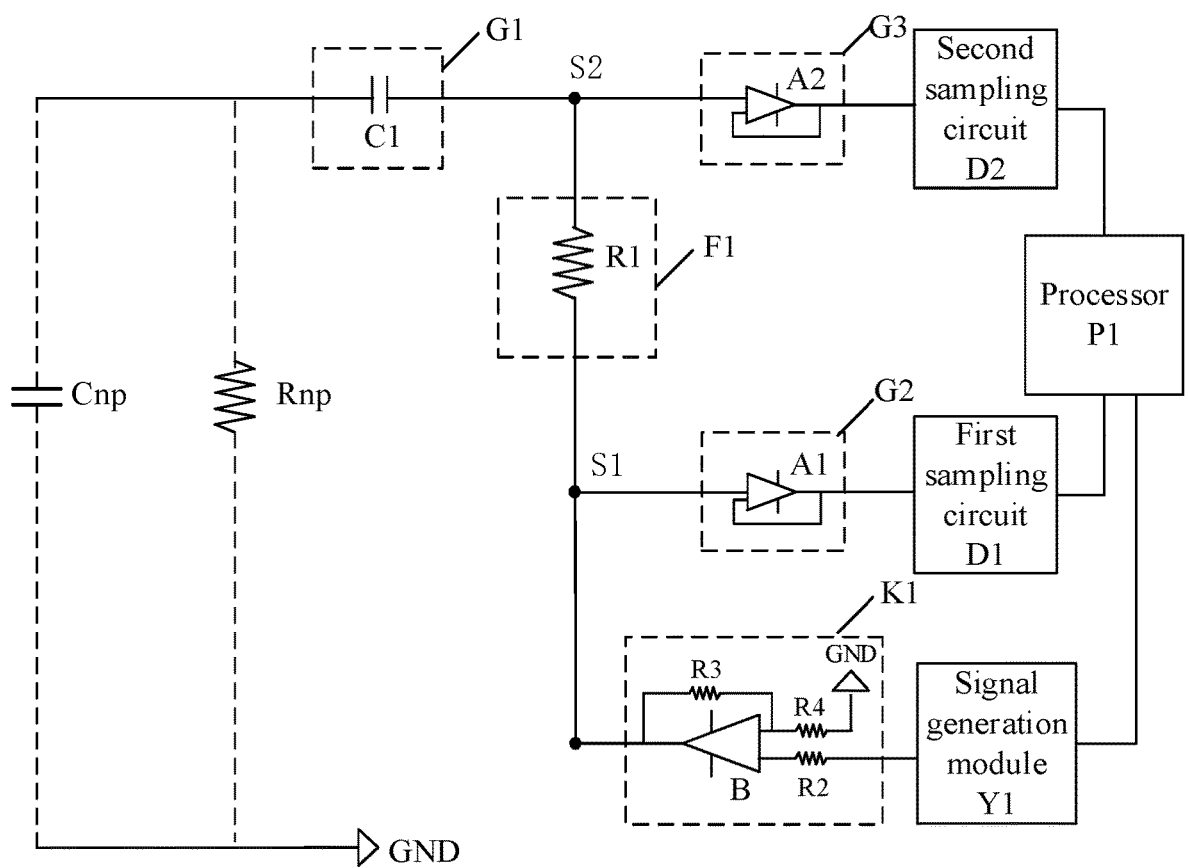
FIG. 5 is an equivalent circuit diagram of the insulation detection circuit corresponding to FIG. 3.

Referring to FIG. 5, since the power battery under detection has a very small internal resistance, the power battery can be considered as equivalent to a short circuit. That is, FIG. 3 is equivalent to FIG. 5.

In FIG. 5, Rnp is the resistance obtained by the parallel connection of the positive electrode insulation resistor Rp and the negative electrode insulation resistor Rn, that is, Rnp=Rn//Rp; and Cnp is the capacitance obtained by the parallel connection of the positive electrode capacitor Cp and the negative electrode capacitor Cn, that is, Cnp=Cn//Cp. The obtained insulation resistance Rnp is smaller than the resistance of Rn or Rp. In the embodiments of the present invention, the insulation resistance Rnp can be used as a standard for measuring the insulation performance.

The derivation process of the insulation resistance Rnp of the power battery under detection of the insulation detection circuit will be described in detail with reference to FIG. 5.

According to series and parallel formulas, the equivalent impedance Znp of the parasitic capacitance Cnp and the insulation resistance Rnp of the power battery under detection can be expressed as:

$$Znp = \frac{Rnp \times ZCnp}{Rnp + ZCnp} \quad (1)$$

Here, ZCnp is the capacitive reactance of the parasitic capacitance Cnp, and the equivalent impedance Znp can be expressed in a vector form as:

$$\frac{Rnp}{w^2 \times Cnp^2 \times Rnp^2 + 1} - \frac{w \times Cnp \times Rnp^2}{w^2 \times Cnp^2 \times Rnp + 1} \times j \quad (2)$$

Here, w is an angular frequency of a sine wave AC signal generated by the signal generation module Y1, and j is the imaginary unit.

Assuming that the equivalent impedance of the parasitic capacitance Cnp, the insulation resistance Rnp and the isolation capacitor C1 is Znp1, according to Kirchhoff's law, voltage amplitudes of a sine wave AC signal between the isolation capacitor C1 and the voltage division resistor (also referred to as a sampling resistor) R1 and the sine wave AC signal generated by the signal generation module Y1 (i.e., the sine wave AC signal provided by the second sampling point S2 and the sine wave AC signal provided by the first sampling point S1) have the following relationship:

$$\frac{U}{u} = \frac{Znp1 + R1}{Znp1} \quad (3)$$

In the formula, U is the voltage amplitude of the sine wave AC signal generated by the signal generation module Y1 and u is the voltage amplitude of the sine wave AC signal between the isolation capacitor C1 and the voltage division resistor R1.

According to Kirchhoff's law, the relationship between the equivalent impedance Znp of the parasitic capacitance Cnp and the insulation resistance Rnp and the equivalent impedance Znp1 of the parasitic capacitance Cnp, the insulation resistance Rnp and the isolation capacitor C1 can be expressed as:

$$Znp = Znp1 - \frac{1}{j \times w \times C1} \quad (4)$$

Assuming that the phase shift of the sine wave AC signal between the isolation capacitor C1 and the voltage division resistor R1 relative to the sine wave AC signal generated by the signal generation module Y1 is θ, the sine wave AC signal between the isolation capacitor C1 and the voltage division resistor R1 can be expressed in a vector form as:

$$u = u \times \cos(\theta) + u \times \sin(\theta) \times j \quad (5)$$

In order to eliminate the phase shift θ, the phase shift θ can be converted into an expression of measurable values. For example, it can be assumed that the instantaneous voltage UA of the sine wave AC signal generated by the signal generation module Y1 can be expressed by the following function of time:

$$UA = U \times \sin(w \times t) + M \quad (6)$$

It can be assumed that the instantaneous voltage UB of the sine wave AC signal between the isolation capacitor C1 and the voltage division resistor R1 at the same moment can be expressed by the following function of time:

$$UB = u \times \sin(w \times t + \theta) + M \quad (7)$$

Here, M is the bias voltage, and t is the time. To improve the calculation accuracy of the insulation resistance, it is desired to simultaneously obtain the first instantaneous voltage at the rising edge of the waveform in the first sampled signal as the UA and the second instantaneous voltage at the rising edge of the waveform in the second sampled signal as the UB.

Combining formula (5)-formula (7), the following formula for calculating the phase shift θ can be derived:

$$\theta = a \times \sin\left(\frac{UB - M}{u}\right) - a \times \sin\left(\frac{UA - M}{U}\right) \quad (8)$$

Combining formula (3), formula (4) and formula (8) and after simplification, the following formula can be derived:

$$Znp = \frac{U \times u \times R1 \times \cos(\theta) - u^2 \times R1}{U^2 - 2 \times U \times u \times \cos(\theta) + u^2} + \quad (9)$$

-continued
$$\left(\frac{U \times u \times R1 \times \sin(\theta)}{U^2 - 2 \times U \times u \times \cos(\theta) + u^2} + \frac{1}{w \times C1}\right) \times j$$

Combining formula (2) and formula (9), the insulation resistance Rnp of the power battery under detection can be derived as follows:

$$Rnp = \frac{(U \times \cos(\theta) - u) \times u \times R1}{U^2 - 2 \times U \times u \times \cos(\theta) + u^2} \times \left[\frac{(w \times C1 \times U \times u \times R1 \times \sin(\theta) + U^2 + u^2 - 2 \times U \times u \times \cos(\theta))^2}{w^2 \times C1^2 \times u^2 \times R1^2 \times (U \times \cos(\theta) - u)^2} + 1\right] \quad (10)$$

As described above, according to the embodiments of the present invention, only two sets of instantaneous voltages UA and UB of the first sampling point S1 and the second sampling point S2 at the same moment need to be measured. Then based on Kirchhoff's law, the sine wave signal acquired at the first sampling point S1 and the sine wave signal acquired at the second sampling point S2 can be processed, so as to calculate the phase shift θ of the second sampling point S2 relative to the first sampling point S1 and further obtain the insulation resistance of the power battery under detection according to formula (10).

Figure 6:
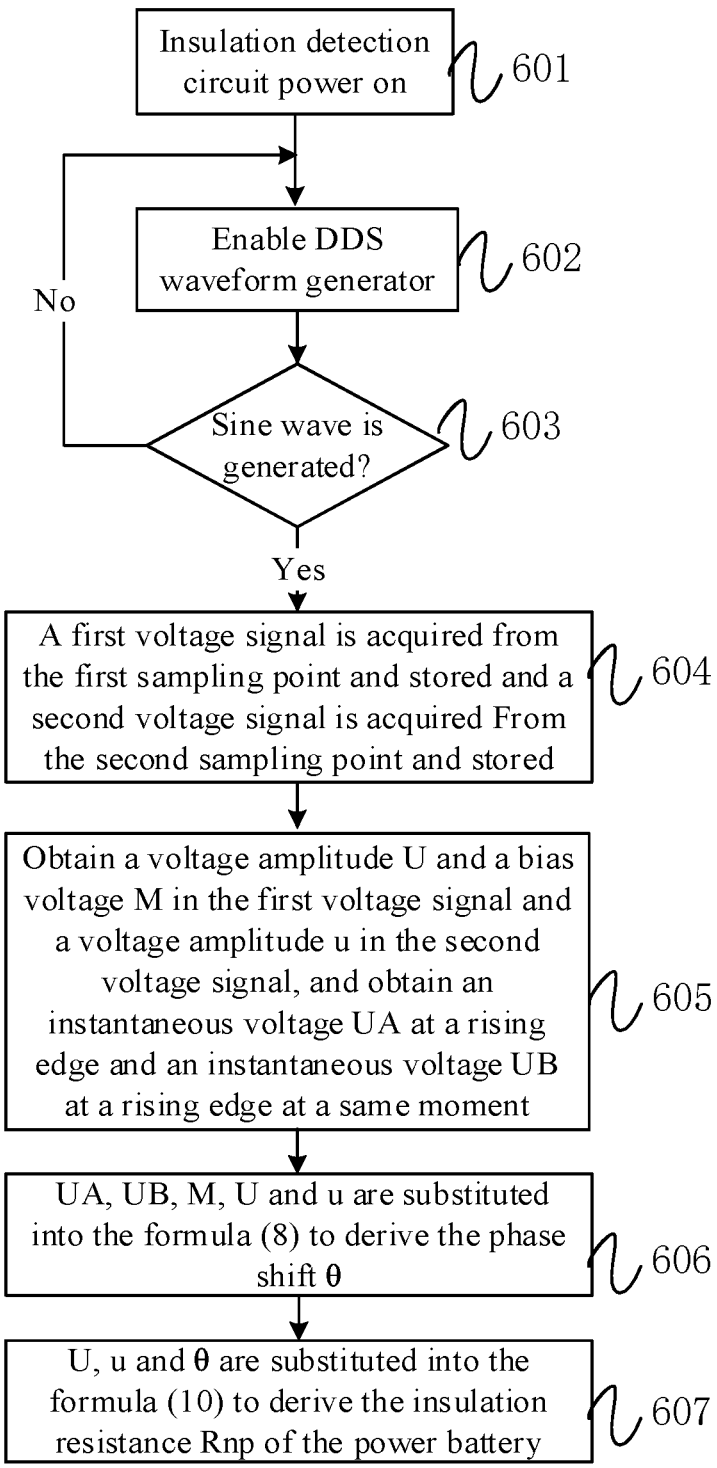
FIG. 6 is a schematic flow chart of an insulation detection method according to a second embodiment of the present disclosure.

FIG. 6 is a schematic flow chart of an insulation detection method according to a second embodiment of the present disclosure. The insulation detection method based on the above described insulation detection circuit shown in FIG. 6 includes steps 601 to 607.

In step 601, the insulation detection circuit is powered on.

In step 602, a DDS waveform generator is enabled.

In step 603, it is determined whether the DDS waveform generator generates a sine wave. If the DDS waveform generator generates a sine wave, then step 604 is executed; if the DDS waveform generator does not generate a sine wave, step 603 is performed again.

In step 604, a first voltage signal is acquired from the first sampling point S1 and stored, and a second voltage signal is acquired from the second sampling point S2 and stored.

In step 605, a voltage amplitude U and a bias voltage M in the first voltage signal and a voltage amplitude u in the second voltage signal are obtained, and an instantaneous voltage UA at a rising edge in the first voltage signal and an instantaneous voltage UB at a rising edge in the second voltage signal at a same moment are obtained.

In step 606, the above UA, UB, M, U and u are substituted into the formula (8) to derive the phase shift θ.

In step 607, the above U, u and θ are substituted into the formula (10) to derive the insulation resistance Rnp of the power battery under detection.

It should be noted that the processor in the embodiments of the present disclosure may be a processor having an independent function, or may be a processor to be integrated into the battery management system, which is not limited herein.

It should be noted that, each embodiment in the disclosure is described in a progressive manner, the same or similar parts in various embodiments may be referred to each other, and each embodiment focuses on differences from other embodiments. For the circuit embodiments, reference may be made to the description of the method embodiments. The embodiments of the present disclosure are not limited to the specific steps and structures described above and shown in the drawings. A person skilled in the art may make various changes, modifications, and additions or change the order of steps after understanding the spirit of the embodiments of the present disclosure. Also, for the sake of conciseness, the detailed description of those known methods or techniques is omitted here.

The functional blocks shown in the block diagrams described above may be implemented in hardware, software, firmware, or a combination thereof. When implemented in hardware, it may be, for example, an electronic circuit, an application specific integrated circuit (ASIC), a suitable firmware, a plug-in, a function card or the like. When implemented in software, elements of the embodiments of the present disclosure are programs or code segments used to perform required tasks. The programs or code segments may be stored in a machine-readable medium or transmitted over a transmission medium or a communication link via data signals carried in carriers. The "machine-readable medium" may include any medium capable of storing or transmitting information. Examples of the machine-readable medium include an electronic circuit, a semiconductor memory device, a ROM, a flash memory, an erasable ROM (EROM), a floppy disk, a CD-ROM, an optical disk, a hard disk, a fiber medium, a radio frequency (RF) link, and the like. The code segments may be downloaded via a computer network, such as the Internet, an intranet, or the like.

The embodiments of the present disclosure may be implemented in other specific forms without departing from the spirit and essential characteristics thereof. For example, the algorithms described in the specific embodiments may be modified as long as the system architecture will not depart from the basic spirit of the embodiments of the present disclosure. The present embodiments are therefore to be considered in all respects as illustrative but not restrictive. The scopes of the embodiments are to be defined by the appended claims rather than the foregoing description. All the changes within the scope of the subject matters of the claims and their equivalents are thus to be included in the scope of the embodiments of the present disclosure.

What is claimed is:

1. An insulation detection circuit, comprising a first isolation module, a voltage division module, a signal generation module, a first sampling point, a second sampling point and a processor, wherein:
   a first end of the first isolation module is connected to a positive electrode of a power battery under detection, and a second end of the first isolation module is connected to the second sampling point;
   the signal generation module is connected to the first sampling point and configured to inject an AC signal of a predetermined frequency into the power battery under detection and provide the first sampling point with a first sampled signal of the predetermined frequency;
   a first end of the voltage division module is connected to the first sampling point, a second end of the voltage division module is connected to the second sampling point, and the voltage division module is configured to provide the second sampling point with a second sampled signal; and
   the processor is configured to calculate an insulation resistance of the power battery under detection according to the first sampled signal and the second sampled signal.

2. The insulation detection circuit of claim 1, wherein the voltage division module comprises a voltage division resistor, a first end of the voltage division resistor is connected to the first sampling point, and a second end of the voltage division resistor is connected to the second sampling point.

3. The insulation detection circuit of claim 1, wherein the first isolation module comprises an isolation capacitor, a first end of the isolation capacitor is connected to the positive electrode of the power battery under detection, and a second end of the isolation capacitor is connected to the second sampling point.

4. The insulation detection circuit of claim 1, further comprising a first sampling circuit, wherein a first end of the first sampling circuit is connected to the first sampling point, a second end of the first sampling circuit is connected to the processor, and the first sampling circuit is configured to acquire the first sampled signal from the first sampling point.

5. The insulation detection circuit of claim 4, further comprising a second isolation module, wherein a first end of the second isolation module is connected to the first sampling point, a second end of the second isolation module is connected to the first sampling circuit, and the second isolation module is configured to isolate signal interference of the first sampling circuit on the first sampling point.

6. The insulation detection circuit of claim 5, wherein the second isolation module comprises a first voltage follower, a first input terminal of the first voltage follower is connected to the first sampling point, and a second input terminal of the first voltage follower is connected to an output terminal of the first voltage follower.

7. The insulation detection circuit of claim 1, further comprising a second sampling circuit, wherein a first end of the second sampling circuit is connected to the second sampling point, a second end of the second sampling circuit is connected to the processor, and the second sampling circuit is configured to acquire the second sampled signal from the second sampling point.

8. The insulation detection circuit of claim 7, further comprising a third isolation module, wherein a first end of the third isolation module is connected to the second sampling point, a second end of the third isolation module is connected to the second sampling circuit, and the third isolation module is configured to isolate signal interference of the second sampling circuit on the second sampling point.

9. The insulation detection circuit of claim 8, wherein the third isolation module comprises a second voltage follower, a first input terminal of the second voltage follower is connected to the second sampling point, and a second input terminal of the second voltage follower is connected to an output terminal of the second voltage follower.

10. The insulation detection circuit of claim 1, further comprising a signal amplification module, wherein a first input terminal of the signal amplification module is connected to the signal generation module, a second input terminal of the signal amplification module is connected to an output terminal of the signal amplification module, the output terminal of the signal amplification module is connected to the first sampling point, and the second input terminal of the signal amplification module is further connected to a reference voltage terminal.

11. The insulation detection circuit of claim 10, wherein the signal amplification module comprises a signal amplifier, a first amplification resistor, a second amplification resistor, and a third amplification resistor, wherein:

a first input terminal of the signal amplifier is connected to the signal generation module, and the first amplification resistor is located on a line between the first input terminal of the signal amplifier and the signal generation module;

a second input terminal of the signal amplifier is connected to the output terminal of the signal amplifier, and the second amplification resistor is located on a line between the second input terminal of the signal amplifier and the output terminal of the signal amplifier;

the output terminal of the signal amplifier is connected to the first sampling point;

the second input terminal of the signal amplification module is further connected to the reference voltage terminal, and the third amplification resistor is located on a line between the second input terminal of the signal amplification module and the reference voltage terminal.

12. The insulation detection circuit of claim 1, wherein the signal generation module is a DDS waveform generator.

13. The insulation detection circuit of claim 1, wherein the predetermined frequency is less than or equal to 50 kHz.

14. A battery management system, comprising the insulation detection circuit of claim 1.

15. A insulation detection method to be applied to the insulation detection circuit of claim 1, comprising:

calculating the insulation resistance of the power battery under detection according to the first sampled signal and the second sampled signal.

16. The insulation detection method of claim 15, wherein the calculating the insulation resistance of the power battery under detection according to the first sampled signal and the second sampled signal comprises:

obtaining a first voltage amplitude and a bias voltage in the first sampled signal and a second voltage amplitude in the second sampled signal, and obtaining a first instantaneous voltage in the first sampled signal and a second instantaneous voltage in the second sampled signal at a same moment;

calculating a phase shift of the second sampled signal relative to the first sampled signal according to the first voltage amplitude, the bias voltage, the first instantaneous voltage, the second voltage amplitude, and the second instantaneous voltage; and calculating the insulation resistance of the power battery under detection according to the phase shift, the first voltage amplitude, and the second voltage amplitude.

17. The insulation detection method of claim 16, wherein the obtaining a first instantaneous voltage in the first sampled signal and a second instantaneous voltage in the second sampled signal at a same moment comprises:

obtaining the first instantaneous voltage at a rising edge of a waveform in the first sampled signal and the second instantaneous voltage at a rising edge of a waveform in the second sampled signal at the same moment.

18. The insulation detection method of claim 16, wherein the calculating the insulation resistance of the power battery under detection according to the phase shift, the first voltage amplitude, and the second voltage amplitude comprises:

calculating the insulation resistance of the power battery under detection according to the phase shift, the first voltage amplitude, the second voltage amplitude, the predetermined frequency, the capacitance of the first isolation module and the resistance of the voltage division module.

* * * * *